United States Patent
Doi

(10) Patent No.: US 9,596,114 B2
(45) Date of Patent: Mar. 14, 2017

(54) PEAK SUPPRESSING DEVICE AND PEAK SUPPRESSING METHOD

(71) Applicant: NEC Corporation, Tokyo (JP)

(72) Inventor: Yoshiaki Doi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/761,766

(22) PCT Filed: Dec. 4, 2013

(86) PCT No.: PCT/JP2013/007122
§ 371 (c)(1),
(2) Date: Jul. 17, 2015

(87) PCT Pub. No.: WO2014/111997
PCT Pub. Date: Jul. 24, 2014

(65) Prior Publication Data
US 2015/0358189 A1   Dec. 10, 2015

(30) Foreign Application Priority Data

Jan. 21, 2013   (JP) ................................ 2013-008592

(51) Int. Cl.
*H04L 27/26*   (2006.01)
*H04B 1/04*    (2006.01)
*H03H 17/02*   (2006.01)

(52) U.S. Cl.
CPC ..... *H04L 27/2614* (2013.01); *H03H 17/0294* (2013.01); *H04B 1/04* (2013.01);
(Continued)

(58) Field of Classification Search
None
See application file for complete search history.

(56) References Cited

U.S. PATENT DOCUMENTS

2002/0042253 A1   4/2002   Dartois
2004/0090283 A1*  5/2004   Naito ................. H04L 27/2624
                                                              333/17.2
(Continued)

FOREIGN PATENT DOCUMENTS

EP   1 195 892 A1      4/2002
JP   2002-185432 A     6/2002
WO   WO-2010/074187 A1 7/2010

OTHER PUBLICATIONS

International Search Report corresponding to PCT/JP2013/007122, dated Mar. 11, 2014 (3 pages).

(Continued)

*Primary Examiner* — Aristocratis Fotakis
(74) *Attorney, Agent, or Firm* — Wilmer Cutler Pickering Hale and Dorr LLP

(57) ABSTRACT

A peak suppressing device (10) includes: a subtracting unit (11) that subtracts a predetermined threshold from an amplitude value of an input signal and generates a first peak signal; a multiplying unit (12) that multiplies the first peak signal by a weight coefficient and generates a second peak signal; a band limiting filter (13) that limits a band of the second peak signal, and generates a third peak signal; a subtracting unit (14) that subtracts the third peak signal from the input signal; and a weight coefficient generating unit (15) that generates the weight coefficient based on a value, the value being an amplitude value of the first peak signal divided by an amplitude value of a fourth peak signal generated when a convolution arithmetic operation is performed on by using at least a tap coefficient used in a center tap of the band limiting filter (13).

8 Claims, 10 Drawing Sheets

(52) U.S. Cl.
CPC ............... *H04B 2001/0408* (2013.01); *H04B 2201/70706* (2013.01); *H04L 27/2624* (2013.01)

(56) References Cited

U.S. PATENT DOCUMENTS

| | | | | |
|---|---|---|---|---|
| 2008/0200126 | A1* | 8/2008 | Okada | H04B 1/707 455/46 |
| 2008/0292014 | A1* | 11/2008 | Naito | H04L 5/0007 375/260 |
| 2009/0245414 | A1* | 10/2009 | Okada | H04B 1/707 375/295 |
| 2010/0151803 | A1* | 6/2010 | Seki | H04L 27/2624 455/127.1 |
| 2011/0227628 | A1* | 9/2011 | Sato | H03F 1/3223 327/361 |
| 2011/0249768 | A1* | 10/2011 | Kuwabara | H04B 1/707 375/295 |
| 2012/0300824 | A1* | 11/2012 | Maehata | H04L 27/2624 375/224 |

OTHER PUBLICATIONS

Extended European Search Report issued by the European Patent Office for Application No. 13871761.6 dated Sep. 2, 2016 (8 pages).

* cited by examiner

PEAK SUPPRESSING DEVICE AND PEAK SUPPRESSING METHOD

CROSS-REFERENCE TO RELATED APPLICATIONS

This application is a national stage application of International Application No. PCT/JP2013/007122 entitled "Peak Suppressing Device and Peak Suppressing Method," filed on Dec. 4, 2013, which claims the benefit of the priority of Japanese Patent Application No. 2013-008592, filed on Jan. 21, 2013, the disclosures of each of which are hereby incorporated by reference in their entirety.

TECHNICAL FIELD

The present invention relates to a peak suppressing device and a peak suppressing method and relates to, for example, a peak suppressing device and a peak suppressing method which use a band limiting filter.

BACKGROUND ART

In recent years, in the field of mobile communication, a high speed down link packet access (HSDPA) of W-CDMA, an OFDM (Orthogonal Frequency Division Multiplex) modulation scheme for improving a frequency use efficiency and the like have been used to improve transmission efficiency. The HSDPA, the OFDM modulation method and the like use the M-ary QAM (Quadrature Amplitude Modulation) scheme. Hence, it is demanded that this scheme have a signal quality (modulation accuracy: EVM or the like) that meets stricter standards than those which a conventional QPSK (Quadrature Phase Shift Keying) scheme is required to meet.

Generally, a low back-off operation of a power amplifier needs to be realized for a purpose of minimizing a transmission device and reducing power consumption. Hence, the power amplifier adopts a peak suppressing circuit which reduces a peak factor of a transmission signal. The peak suppressing circuit tolerates slight quality deterioration of a transmission signal, and performs signal processing for suppressing peak components.

A peak suppressing circuit disclosed in Patent Literature 1 will be described below. The peak suppressing circuit receives an IQ signal. The IQ signal is a signal having in-phase components and quadrature components, and is a signal whose spectrum band is limited to satisfy each carrier signal requirement per transmission system. The peak suppressing circuit detects an amplitude value of the received IQ signal, and determines a peak position which needs to be suppressed. Further, the peak suppressing circuit subtracts a generated signal (referred to as a peak suppression signal below) from the inputted IQ signal to suppress a peak. The band of the peak suppression signal is limited by using a FIR filter to make a signal of a frequency band which is substantially the same as a spectrum band of the IQ signal or settles in a range of the spectrum band.

In this regard, when the FIR filter which limits a band receives an input of a plurality of continuous peak pulses, an output response of a band limiting filter to a peak pulse input at a given point among these continuous peak pulses is larger than the amplitude of an original peak pulse due to a convolution influence (an overlap of impulse responses).

Hence, the peak suppressing circuit multiplies a peak pulse by a weight coefficient of a fixed value according to a peak pulse detection position, and reduces the amplitude of the peak pulse. Thus, the convolution influence in the band limiting filter is reduced.

CITATION LIST

Patent Literature

PTL 1: International Patent Publication No. WO2010/074187
PTL 2: Japanese Patent No. 3954341

SUMMARY OF INVENTION

Technical Problem

However, the peak suppressing circuit disclosed in Patent Literature 1 cannot prevent excessive peak suppression in some cases as described below.

FIG. 7 is a view illustrating an example of tap coefficients of a band limiting filter, and FIG. 8 is a view illustrating an example of tap coefficients different from those in FIG. 7.

For example, FIG. 7 illustrates an example where the number of tap coefficients of the band limiting filter illustrated is relatively small. According to the band limiting filter illustrated in FIG. 7, when a coefficient of a center tap whose peak detection point and timing match is 1.0, the tap coefficients of neighboring taps (sample points) before and after the center tap are about 0.5. In addition, other tap coefficients are small, and therefore, compared to the center tap, a convolution influence in an output value of the band limiting filter is dominant in the neighboring taps before and after the center tap. Hence, processing for selecting a weight coefficient of a fixed value by determining whether or not a peak is detected at neighboring points before and after a given peak point in the peak suppressing circuit in Patent Literature 1 can prevent excessive peak suppression due to the convolution influence in the output value of the band limiting filter to some degree.

However, as signal processing speeds up and a broader band is used, the number of taps of a band limiting filter is increased in some cases. For example, when a quadruple sampling frequency as that of the example illustrated in FIG. 7 is assumed, the tap coefficients as illustrated in FIG. 8 are used. In this case, an output of the band limiting filter is influenced by a convolution influence of a very wide range of taps in addition to neighboring taps before and after a center tap. Hence, there is a problem that the processing of the peak suppressing circuit of Patent Literature 1 cannot prevent excessive peak suppression. This problem will be described in detail below.

FIG. 9 is a view for explaining a convolution influence (an overlap of impulse responses) in an output value of a band limiting filter in the case of the tap coefficients of the band limiting filter illustrated in FIG. 7. FIG. 10 is a view for explaining a convolution influence (an overlap of impulse responses) in an output value of the band limiting filter in the case of the tap coefficients of the band limiting filter illustrated in FIG. 8. Both of FIGS. 9 and 10 illustrate cases where a peak amplitude (threshold exceeding peak amplitude in FIGS. 9 and 10) exceeding a threshold Th continues over four samples, and the highest amplitude of the third sample is normalized and expressed as 1.0.

Both of FIGS. 9 and 10 illustrate output signals (synthesis signals of band limiting peak pulses in FIGS. 9 and 10) of the band limiting filter whose peak pulse signals of limited bands overlap (peak pulses after bands are limited in FIGS.

9 and 10) when peak pulses to be inputted to the band limiting filter are inputted to the band limiting filter having the tap coefficients illustrated in FIGS. 7 and 8 without multiplying the peak pulses with weight coefficients.

As is understandable from FIG. 9, in the example of the tap coefficients illustrated in FIG. 7, an output value of the band limiting filter is about 1.5 multiples with respect to a peak amplitude of amplitude 1.0 of the third sample. In contrast with this, as is understandable from FIG. 10, in the example of the tap coefficients illustrated in FIG. 8, the output value of the band limiting filter increases to about 2.8 multiples with respect to the peak amplitude of the amplitude 1.0 of the third sample and is influenced by a convolution influence from a very wide range of taps. Hence, in the example of the tap coefficients illustrated in FIG. 8, only processing for selecting a weight coefficient of a fixed value by determining whether or not a peak of a given peak point is detected at neighboring points before and after the given peak point cannot prevent excessive peak suppression caused by a convolution influence of a wide range of taps.

Next, another technique will be described with reference to the drawings using Patent Literature 2 as an example. According to a configuration disclosed in Patent Literature 2, only peak signals satisfying a selection criterion given by the number defined in advance or a position (time interval) between peak signals among peaks whose amplitudes exceed a threshold in a time window of a period defined in advance are selected, and a peak suppression signal is generated based on this information. A pulse amplitude with respect to a peak signal which is not selected is set to 0 (zero). That is, instead of suppressing all peak signals exceeding the threshold, peak suppression signals are generated only for peak signals whose number is defined in advance in order from the top peak signal or which are spaced a time interval or more defined in advance apart in a time window of a period defined in advance.

This technique is not configured to generate suppression pulse signals for all peaks, and therefore a problem that the amplitude becomes substantially greater than the amplitude of an original input pulse due to a convolution influence (an overlap of impulse responses) in an output value of the band limiting filter is reduced in at least one processing procedure. However, this technique works only under the conditions that time intervals at which a peak and a peak are produced are sufficiently distant, and has the problems that a plurality of peaks exceeding a threshold are produced in a short time, and, when peaks continue for a long period of time, the peaks cannot be sufficiently suppressed and signals exceeding the threshold remain. Japanese Patent No. 3954341 discloses an example where a peak suppressing circuit is connected at a plurality of stages in cascade to repeat the same processing a plurality of times to overcome these above problems. Hence, while a convolution influence in an output value of a band limiting filter is reduced in one processing procedure, when processing is repeated a plurality of times to overcome a problem that peak suppression is insufficient, a convolution influence in an output of the band limiting filter eventually becomes significant. Therefore, similar to Patent Literature 1, the peak suppressing circuit disclosed in Patent Literature 2 cannot prevent excessive peak suppression caused by a convolution influence from a wide range of taps, either.

It is therefore an object of the present invention to provide a peak suppressing device and a peak suppressing method which optimally suppress peaks without causing insufficient suppression or excessive suppression even when input signals exceeding a threshold continue for a long period of time.

Solution to Problem

A peak suppressing device according to a first aspect in accordance with the present invention includes: a first subtracting unit that subtracts a predetermined threshold from an amplitude value of an input signal and generates a first peak signal; a multiplying unit that multiplies the first peak signal by a weight coefficient and generates a second peak signal; a band limiting filter that limits a band of the second peak signal by using a filter including a plurality of tap coefficients, and generates a third peak signal; a second subtracting unit that subtracts the third peak signal from the input signal; and a weight coefficient generating unit that generates the weight coefficient based on a value, the value being an amplitude value of the first peak signal divided by an amplitude value of a fourth peak signal generated when a convolution arithmetic operation is performed on by using at least a tap coefficient used in a center tap of the band limiting filter and tap coefficients used as taps before and after the center tap.

A peak suppressing method according to a second aspect in accordance with the present invention includes: subtracting a predetermined threshold from an amplitude value of an input signal, and generating a first peak signal; generating a weight coefficient based on a value, the value being divided an amplitude value of the first peak signal by an amplitude value of a tap coefficient multiplied peak signal generated when a convolution arithmetic operation is performed on by using at least a tap coefficient used in a center tap of a band limiting filter and tap coefficients used as taps before and after the center tap; multiplying the first peak signal by the weight coefficient, and generating a second peak signal; and limiting a band of the second peak signal by using the band limiting filter including a plurality of tap coefficients, generating a third peak signal and subtracting the third peak signal from the input signal.

Advantageous Effects of Invention

According to the present invention, it is possible to provide a peak suppressing method and circuit which optimally suppress peaks without causing insufficient suppression or excessive suppression even when input signals exceeding a threshold continue for a long period of time.

DESCRIPTION OF EMBODIMENTS

First Embodiment

Figure 1:
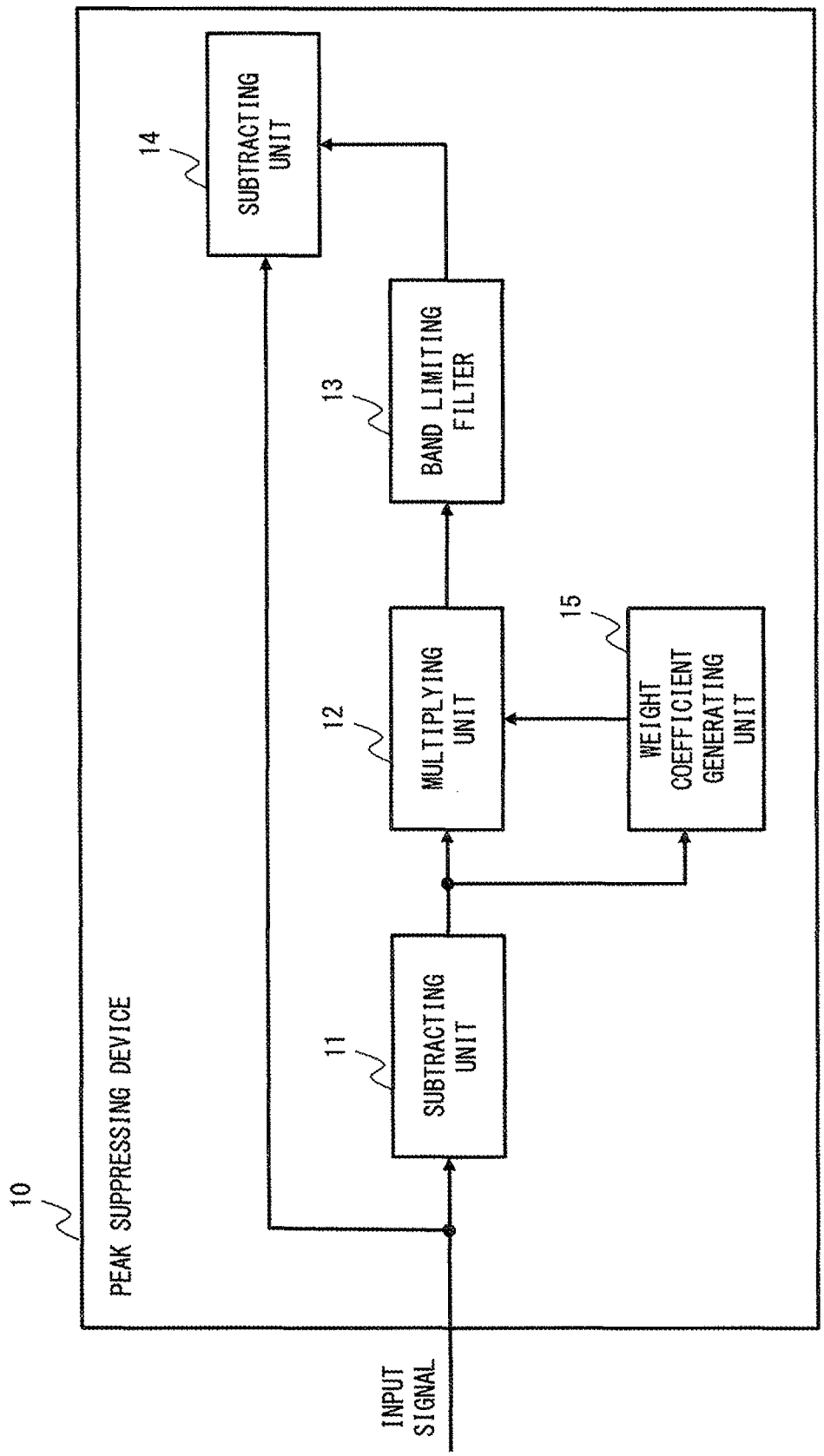
FIG. 1 is a configuration diagram of a peak suppressing device according to a first embodiment.

The embodiment of the present invention will be described below with reference to the drawings. First, a configuration example of a peak suppressing device 10 according to the first embodiment of the present invention will be described with reference to FIG. 1. The peak suppressing device 10 includes a subtracting unit 11, a multiplying unit 12, a band limiting filter 13, a subtracting unit 14 and a weight coefficient generating unit 15.

The subtracting unit 11 receives an input signal transmitted from other circuits, other devices or the like. Further, the subtracting unit 11 subtracts a predetermined threshold from an amplitude value of the input signal, and outputs the subtracted signal to the multiplying unit 12. The signal obtained by subtracting the predetermined threshold from the input signal has an amplitude exceeding the predetermined threshold, and may be referred to as, for example, a peak signal. Alternatively, the peak signal is a signal used to suppress a peak value of the input signal in a circuit or a functional block at a subsequent stage, and therefore may be referred to as a peak suppression pulse signal.

The multiplying unit 12 multiplies by a weight coefficient the peak signal outputted from the subtracting unit 11, and outputs the peak signal multiplied by the weight coefficient to the band limiting filter 13. An amplitude value of the peak signal to be outputted from the multiplying unit 12 becomes small when the peak signal to be outputted from the subtracting unit 11 is multiplied by a weight coefficient.

The band limiting filter 13 limits a band of the peak signal outputted from the multiplying unit 12, and outputs the peak signal of the limited band to the subtracting unit 14. The band limiting filter 13 limits the band by using a filter having a plurality of tap coefficients. The tap coefficients may be determined based on information of a carrier signal outputted from, for example, an external device.

The subtracting unit 14 subtracts the peak signal outputted from the band limiting filter 13 from the input signal received from the peak suppressing device 10. Thus, the peak suppressing device 10 suppresses the amplitude at a peak position of the input signal, and outputs the input signal of the suppressed amplitude to an external device or the like.

Hereinafter, the weight coefficient generating unit 15 which generates a weight coefficient to be used in the multiplying unit 12 will be described. The weight coefficient generating unit 15 performs a convolution arithmetic operation on the peak signal outputted from the subtracting unit 11 by using at least a tap coefficient used in a center tap of the band limiting filter 13 and tap coefficients used in taps before and after the center tap. The weight coefficient generating unit 15 may perform a convolution arithmetic operation on the peak signal by using the same number of taps and tap coefficients as those of the band limiting filter 13.

Further, the weight coefficient generating unit 15 outputs a value obtained by dividing the amplitude value of the peak signal outputted from the subtracting unit 11 by a value subjected to the convolution arithmetic operation, as a weight coefficient to the multiplying unit 12.

As described above, the peak suppressing device according to the first embodiment of the present invention outputs to the band limiting filter 13 the peak signal multiplied by the weight coefficient generated by the weight coefficient generating unit 15. The weight coefficient generating unit 15 performs a convolution arithmetic operation by using at least a tap coefficient used in a center tap of the band limiting filter 13 and tap coefficients used in taps before and after the center tap, so that it is possible to calculate in advance a convolution influence caused by an overlap of pulses in the peak signal outputted from the band limiting filter 13. Hence, the band limiting filter 13 performs filter processing for limiting the band of the peak signal multiplied with the weight coefficient calculated by taking into account the convolution influence in the band limiting filter 13. Thus, the subtracting unit 14 can subtract from the input signal the peak signal from which the convolution influence in the band limiting filter 13 is reduced.

Figure 2:
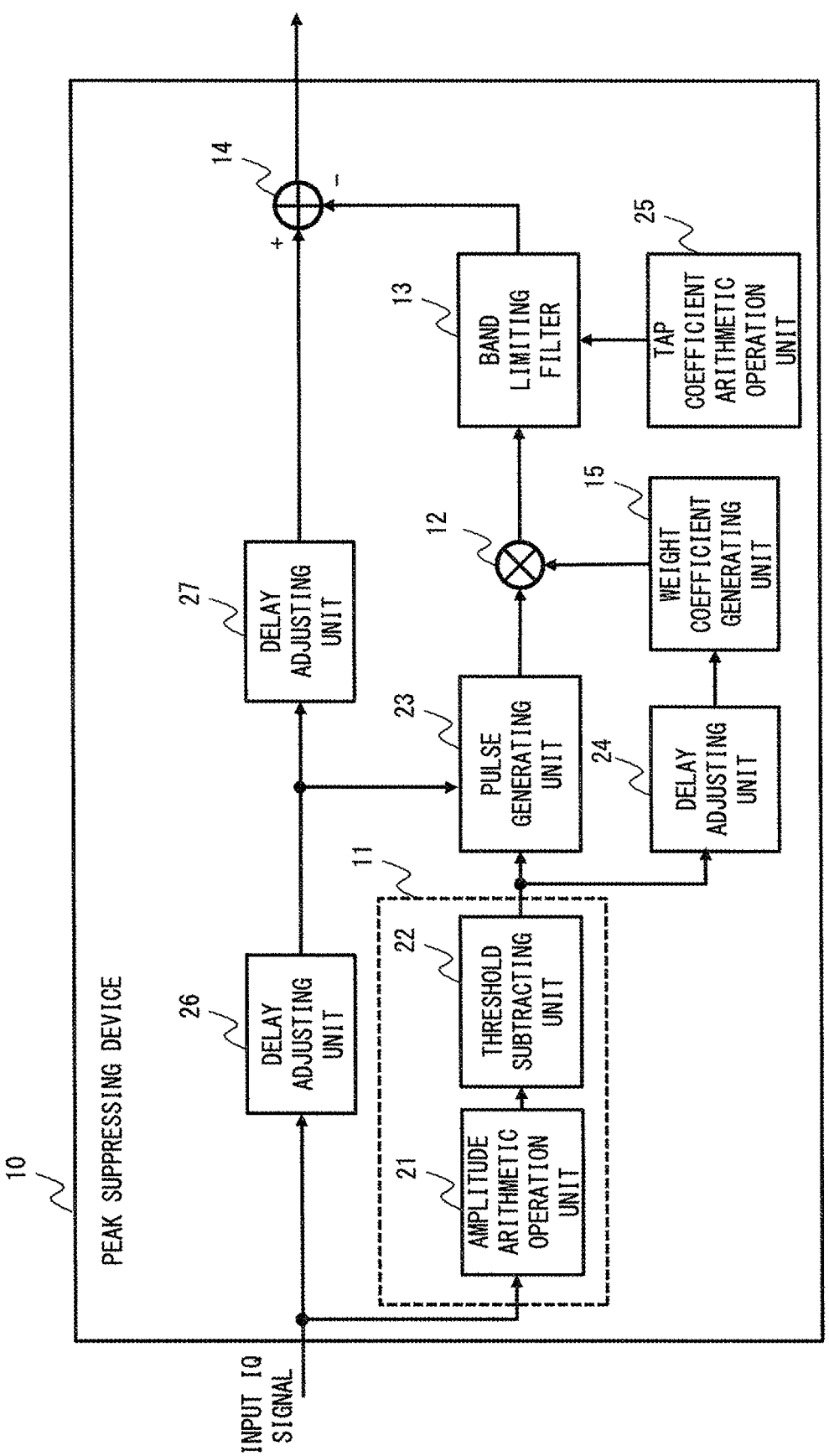
FIG. 2 is a configuration diagram of the peak suppressing device according to the first embodiment.

Next, a detailed configuration example of the peak suppressing device 10 according to the first embodiment of the present invention will be described with reference to FIG. 2. The peak suppressing device 10 includes the multiplying unit 12, the band limiting filter 13, the subtracting unit 14, the weight coefficient generating unit 15, an amplitude arithmetic operation unit 21, a threshold subtracting unit 22, a pulse generating unit 23, a delay adjusting unit 24, a tap coefficient arithmetic operation unit 25, a delay adjusting unit 26 and a delay adjusting unit 27. The same components of the peak suppressing device 10 in FIG. 2 as those in FIG. 1 will be assigned the same reference numerals and described. Further, the amplitude arithmetic operation unit 21 and the threshold subtracting unit 22 correspond to the subtracting unit 11 in FIG. 1.

The peak suppressing device 10 receives an input IQ signal as an input signal. The input IQ signal is a signal whose spectrum band is limited to satisfy each carrier signal requirement per transmission system. The input IQ signal has in-phase components and quadrature components.

The amplitude arithmetic operation unit 21 calculates an amplitude value R of the input IQ signal. The threshold subtracting unit 22 calculates R−Th by subtracting a threshold Th which can be arbitrarily set, from the amplitude value R. The threshold subtracting unit 22 outputs R−Th as a subtraction result to the pulse generating unit 23 and the delay adjusting unit 24. The threshold subtracting unit 22 performs processing for setting an amplitude value of a signal point at which R−Th<0 is true, to level 0, and outputs a subtraction result.

The pulse generating unit 23 generates a peak suppression pulse signal. The pulse generating unit 23 receives the subtraction result of R−Th from the threshold subtracting unit 22. Further, the pulse generating unit 23 receives the input IQ signal to which a predetermined delay has been given by the delay adjusting unit 26. The predetermined delay is, for example, a processing time of the input IQ signal spent between the amplitude arithmetic operation unit 21 and the pulse generating unit 23.

The pulse generating unit 23 multiplies phase information exp(jθ) of the input IQ signal outputted from the delay adjusting unit 26 and R−Th outputted from the threshold subtracting unit 22, and generates a peak suppression pulse signal of (R−Th)exp(jθ). In this regard, exp(jθ)=cos θ+j sin θ (j is an index representing an imaginary number) is true. Thus, the pulse generating unit 23 calculates a vector (pulse) which is a peak pulse signal for limiting only the amplitude to the threshold Th without changing a phase of the signal point having the amplitude equal to or more than the threshold Th on a complex plane.

The weight coefficient generating unit 15 receives an arithmetic operation result R−Th to which the predetermined delay has been given by the delay adjusting unit 24. The predetermined delay refers to, for example, a processing time spent between the pulse generating unit 23 and the multiplying unit 12 to generate a peak suppression pulse signal. The weight coefficient generating unit 15 calculates in advance an overlap of pulses in an output signal of the band limiting filter 13 caused by the tap coefficients of the band limiting filter 13 at a subsequent stage, and generates based on a calculation result a weight coefficient for adaptively adjusting a peak suppression pulse signal amplitude whose band is not yet limited. Further, the weight coefficient generating unit 15 generates the weight coefficient based on the arithmetic operation result R−Th, and outputs the generated weight coefficient to the multiplying unit 12. An operation of the weight coefficient generating unit 15 will be described in detail later.

The multiplying unit 12 multiplies the peak suppression pulse signal outputted from the pulse generating unit 23, by the weight coefficient outputted from the weight coefficient generating unit 15. Thus, the multiplying unit 12 generates the peak suppression pulse signal whose amplitude has been adjusted by using the weight coefficient, and outputs the generated peak suppression pulse signal to the band limiting filter 13.

The band limiting filter 13 has filter characteristics having a frequency band which is substantially the same as a spectrum band of the input IQ signal (transmission carrier signal) or settles in a range of the spectrum band. For example, the band limiting filter 13 is a filter circuit configured by using a FIR filter. Further, the band limiting filter 13 uses tap coefficients determined by the tap coefficient arithmetic operation unit 25 which calculates the tap coefficients by using information of a carrier signal set from outside. The band limiting filter 13 outputs the peak suppression pulse signal whose band has been limited to the subtracting unit 14.

The delay adjusting unit 27 adjusts a delay such that a timing of a center tap of the band limiting filter 13 matches with a timing of a peak detection point which is detected as a suppression target in the input IQ signal.

The subtracting unit 14 subtracts the peak suppression pulse signal outputted from the band limiting filter 13, from the input IQ signal whose delay has been adjusted by the delay adjusting unit 27, and suppresses a peak value to the threshold Th.

Next, a configuration example of the weight coefficient generating unit 15 according to the first embodiment of the present invention will be described with reference to FIG. 3. The weight coefficient generating unit 15 is a FIR filter whose center tap is an mth tap and whose number of taps is 2m−1. That the number of taps is 2m−1 means that the FIR filter has, for example, tap coefficients $C_1$ to $C_{2m-1}$. The tap coefficient of the center tap is $C_m$. The weight coefficient generating unit 15 includes one sample delay units 31_1 to 31_2m−2, tap coefficient multiplying units 32_1 to 32_2m−1, an adding unit 33 and a dividing unit 34.

The one sample delay unit 31_1 receives R−Th calculated by the threshold subtracting unit 22, through the delay adjusting unit 24. Further, the one sample delay unit 31_1 holds a value of R−Th for a predetermined period, and outputs the value to the one sample delay unit 31_2. That is, the one sample delay unit 31_1 to 31_2m2 perform shift processing on values of R−Th continuously inputted to the weight coefficient generating unit 15, and outputs the values to a one sample delay unit at a next stage. The one sample delay units 31_1 to 31_2m2 may be referred to as shift processing units.

Further, the threshold subtracting unit 22 performs processing for setting a signal point of R−Th<0 to level 0, and outputs level 0. Hence, the weight coefficient generating unit 15 receives the arithmetic operation result R−Th of R−Th≥0 from the delay adjusting unit 24. That is, the threshold subtracting unit 22 outputs 0 when there is no amplitude R exceeding the threshold Th at a given sampling point.

The tap coefficient multiplying unit 32_1 multiplies R−Th calculated by the threshold subtracting unit 22 through the delay adjusting unit 24 by a tap coefficient C1, and outputs C1(R−Th) to the adding unit 33. Similarly, when an output of the one sample delay unit of a k (k=1 to 2m−1)th tap is Rk−Th, the tap coefficient multiplying unit 32_k outputs Ck(Rk−Th) to the adding unit 33. Further, at the center tap of the mth tap, the tap coefficient multiplying unit 32_m multiplies an output value Rm−Th of the one sample delay unit 31_m−1 by a tap coefficient Cm, and outputs Cm(Rm−Th) to the adding unit 33 and the dividing unit 34.

The adding unit 33 adds the values outputted from the tap coefficient multiplying units 32_1 to 32_2m−1, and outputs the added value (referred to as an output value B below) to the dividing unit 34.

The dividing unit 34 divides the output value Cm(Rm−Th) (referred to as an output value A below) of the center tap of the mth tap by the output value B of the adding unit 33. The dividing unit 34 outputs the division result of equation 1 as a weight coefficient to the multiplying unit 12.

[Mathematical 1]

$$\frac{Cm*(Rm-Th)}{\sum_{k=1}^{2m-1} Ck*(Rk-Th)} \qquad (1)$$

In this regard, the weight coefficient generating unit 15 is provided to calculate in advance a convolution influence (an overlap of pulses) in the output value of the band limiting filter 13, and determine a weight coefficient. Hence, the number of taps which is 2m−1 in the weight coefficient generating unit 15 may be the same number of taps in the band limiting filter 13, or may be configured to be selected from several taps before and after a center tap at which an overlap influence becomes dominant among taps of the band limiting filter 13. Further, tap coefficients C1, C2, . . . , Cm−1, Cm, Cm+1, . . . and C2m−1 may also be the same tap coefficients of the band limiting filter 13 or take approximate values.

According to the configuration of the weight coefficient generating unit 15, the output value B of the adding unit 33 corresponds to an output value influenced by a convolution arithmetic operation (an overlap of pulses) in the band limiting filter 13 at the subsequent stage with respect to the arithmetic operation result R−Th at a given peak point adjusted to match a timing of a center tap. The dividing unit 34 outputs as a weight coefficient a result obtained by dividing the output value A of the center tap by the output value B of the adding unit. The multiplying unit 12 can suppress a convolution influence (an overlap of pulses) caused in the band limiting filter 13 at the subsequent stage by multiplying the peaks suppression pulse signal outputted from the pulse generating unit 23 by a weight coefficient.

Figure 4:
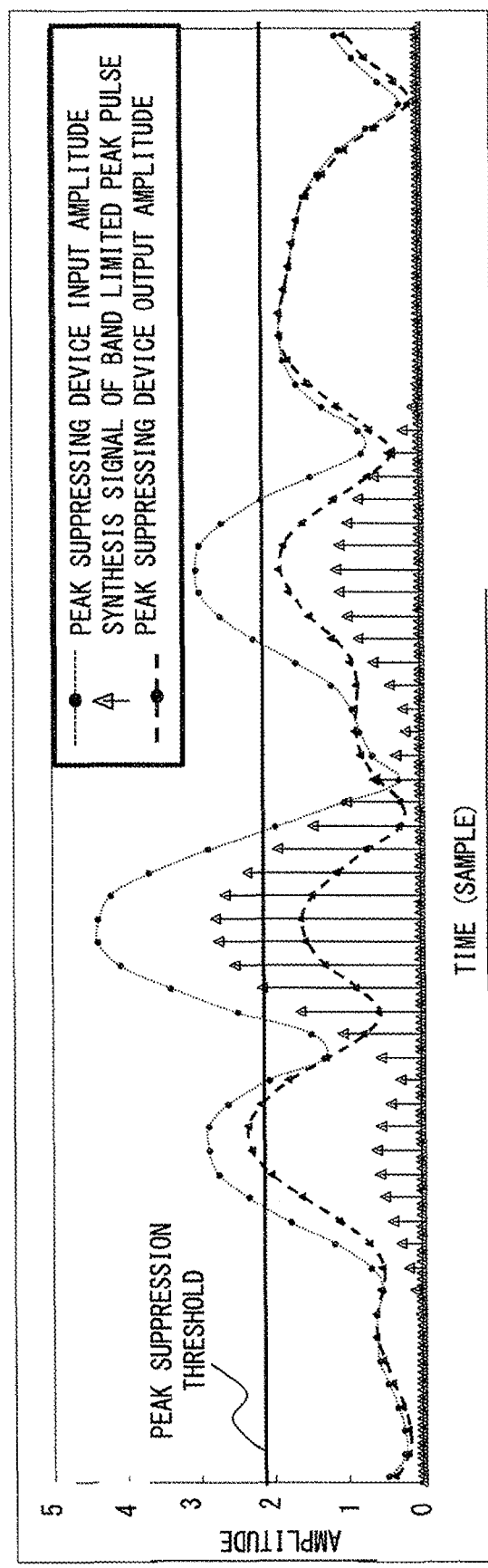
FIG. 4 is a view illustrating a relationship of an output amplitude according to the first embodiment.
Figure 8:
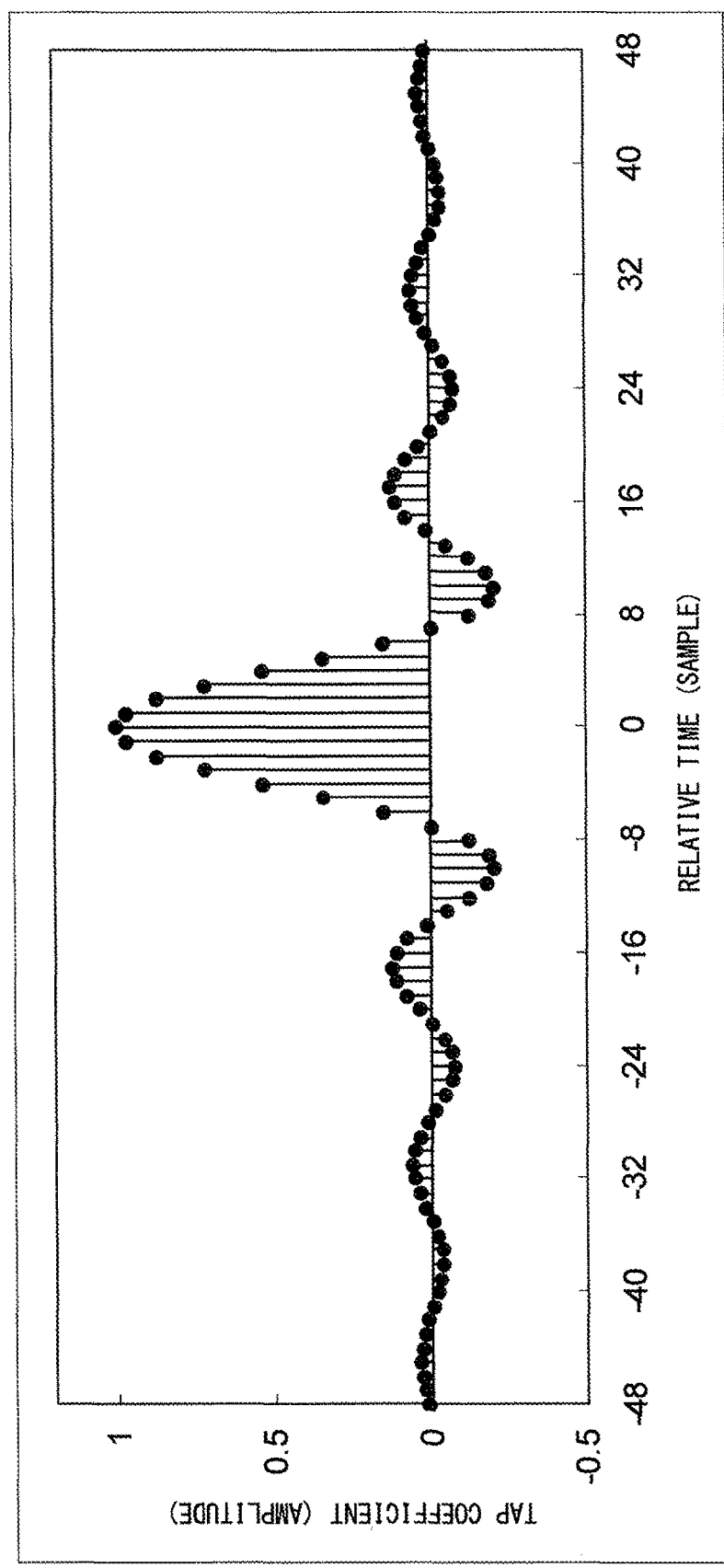
FIG. 8 is a view illustrating tap coefficients of the band limiting filter.
Figure 9:
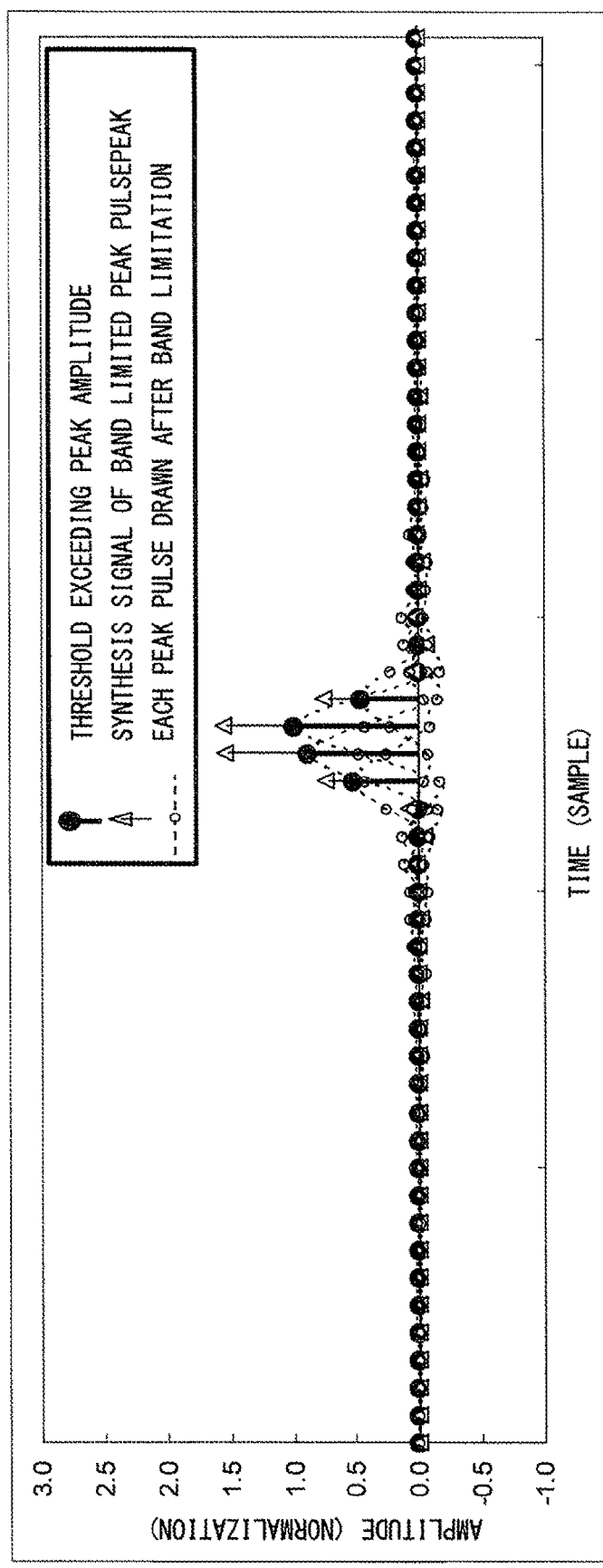
FIG. 9 is a view illustrating an output amplitude of a band limiting filter when the tap coefficients in FIG. 7 are used.
Figure 10:
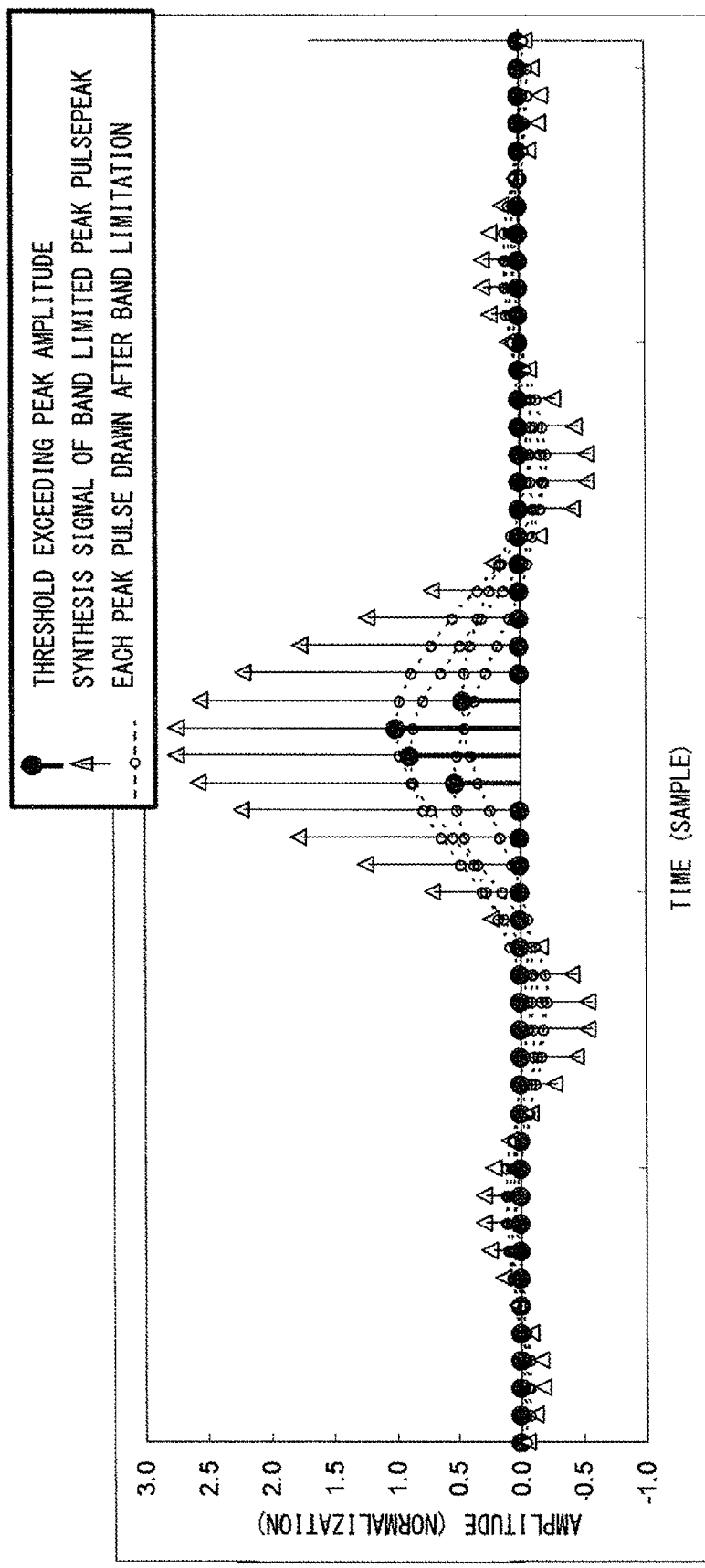
FIG. 10 is a view illustrating an output amplitude of the band limiting filter when the tap coefficients in FIG. 8 are used.

FIG. 4 is a view illustrating a relationship between an input amplitude of a peak suppressing circuit, a peak pulse after band limiting filtering and an output amplitude of the peak suppressing circuit when processing for selecting a weight coefficient of a fixed valued is performed in response to a convolution influence in the output of the band limiting filter 13 having the tap coefficients illustrated in FIG. 8 by determining whether or not peaks have been detected at neighboring points before and after a given point as disclosed in Patent Literature 1. When peaks exceeding the threshold continue for a long period of time, a target peak suppression threshold is insufficiently suppressed or excessively suppressed, and the peak is not optimally suppressed.

Figure 5:
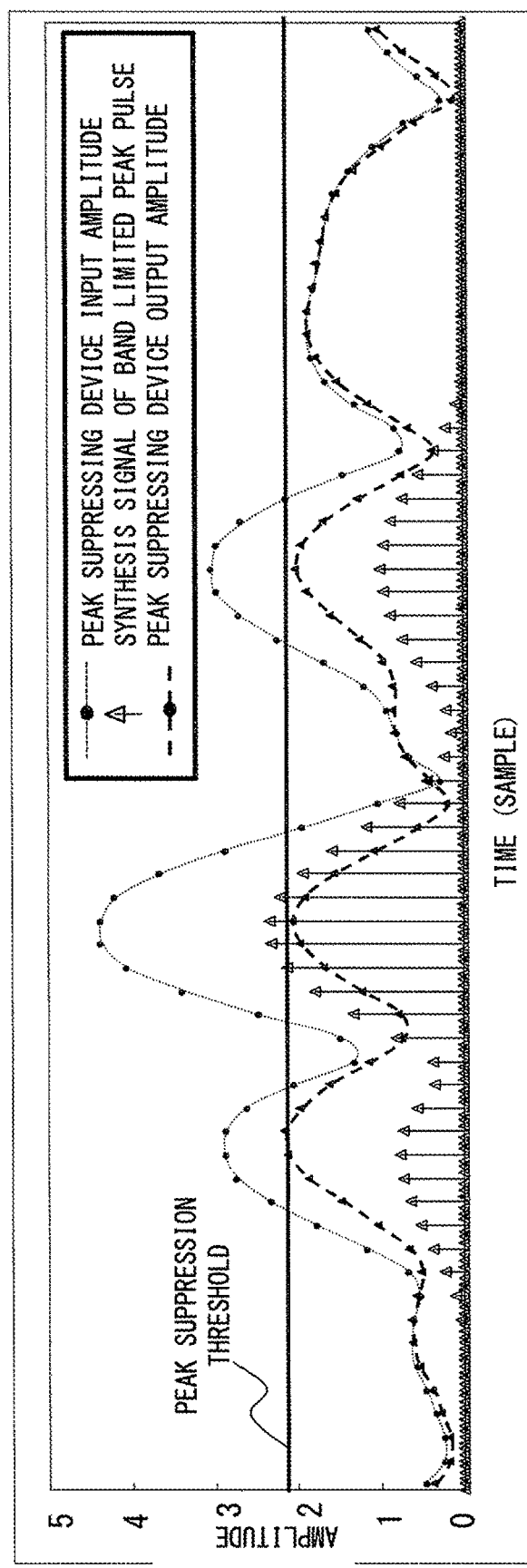
FIG. 5 is a view illustrating a relationship of an output amplitude according to the first embodiment.

FIG. 5 is a view illustrating a relationship between an input amplitude of a peak suppressing circuit, a peak pulse after band limiting filtering and an output amplitude of the peak suppressing circuit when the weight coefficient generating unit 15 according to the present invention performs processing for adaptively adjusting the weight coefficient in response to a convolution influence in the output of the band limiting filter 13 having the tap coefficients illustrated in FIG. 8. It is found that, even when peaks exceeding a threshold continue for a long period of time, it is possible to suppress a peak to a target peak suppression threshold without causing insufficient suppression or excessive suppression, and that the convolution influence in the output of the band limiting filter having the tap coefficients is improved by the method and the circuit according to the present invention.

As described above, according to the peak suppressing method and circuit of the present invention, it is possible to optimally suppress a peak without causing insufficient suppression or excessive suppression even when input signals exceeding a threshold continue for a long period of time. The optimal peak suppression can be realized since a rate of an amplitude of a peak with respect to an output value of a convolution arithmetic operation in the band limiting filter 13 is calculated for peaks which are continuously produced, and a weight coefficient is generated based on this calculation result.

Second Embodiment

Next, a configuration example of a weight coefficient generating unit 40 according to the second embodiment of the present invention will be described with reference to FIG. 6. The same elements of the weight coefficient generating unit 40 in FIG. 6 as those of a weight coefficient generating unit 15 in FIG. 3 will be assigned the same reference numerals, and will not be described in detail. The weight coefficient generating unit 40 is used in FIGS. 1 and 2 instead of the weight coefficient generating unit 15.

The weight coefficient generating unit 40 includes one sample delay units 31_1 to 31_2m−2, a counter 41, an adding unit 42, a dividing unit 43, a coefficient arithmetic operation unit 44 and a multiplying unit 45. Compared to the weight coefficient generating unit 15, the weight coefficient generating unit 40 is provided with the counter 41 instead of a multiplier for tap coefficients to reduce a circuit scale. The weight coefficient generating unit 40 is a FIR filter whose center tap is an mth tap and whose number of taps is 2m−1. In this regard, the weight coefficient generating unit 40 does not include a multiplier for tap coefficients. Hence, the weight coefficient generating unit 40 operates as a FIR filter whose tap coefficients are all one multiple.

The counter 41 counts the number of R−Th which is outputted from a threshold subtracting unit 22 and which is not 0 and the number of Rk−Th (k=1 to 2m−1) which is outputted from the one sample delay units 31_1 to 31_2m−2 and which is not 0, respectively. The number of Rk−Th which is not 0 and has been counted by the counter 41 is a counted number N (N is an integer equal to or more than 0). The threshold subtracting unit 22 processes a signal point of R−Th<0 assuming that a signal point is at level 0. Hence, the threshold subtracting unit 22 outputs 0 when there is not an amplitude R exceeding a threshold Th at a given sampling point. That is, the counter 41 counts the number of amplitudes Rk exceeding the threshold Th. Rk−Th is an output value of a one sample delay unit of a kth tap.

The adding unit 42 adds R−Th outputted from the threshold subtracting unit 22 and Rk−Th outputted from the one sample delay units 31_1 to 31_2m−2, respectively, and outputs the added value (referred to an output value D below) to the dividing unit 43.

The one sample delay unit 31_m−1 outputs an output value Rm−Th (referred to as an output value C below) of a center tap of the mth tap, to the dividing unit 43. The dividing unit 43 divides the output value Rm−Th (output value C) of the center tap of the mth tap by the output value D of the adding unit 42.

The coefficient arithmetic operation unit 44 calculates a correction coefficient by using the counted number N outputted from the counter 41 and an arbitrary setting value D set in advance. For example, the correction coefficient is indicated as f(N) as a function of the counted number N. The coefficient arithmetic operation unit 44 calculates a correction coefficient by using the arbitrary setting value D set in advance according to f(N)=g(N)×D when a function is g(N) which uses the counted number N as a variable. The function g(N) is determined according to the number of taps or tap coefficients used in a band limiting filter 13.

The multiplying unit 45 multiplies a division result C/D outputted from the dividing unit 43, by a correction coefficient f(N) outputted from the coefficient arithmetic operation unit 44. The multiplying unit 45 outputs a multiplication result as a weight coefficient.

Figure 6:
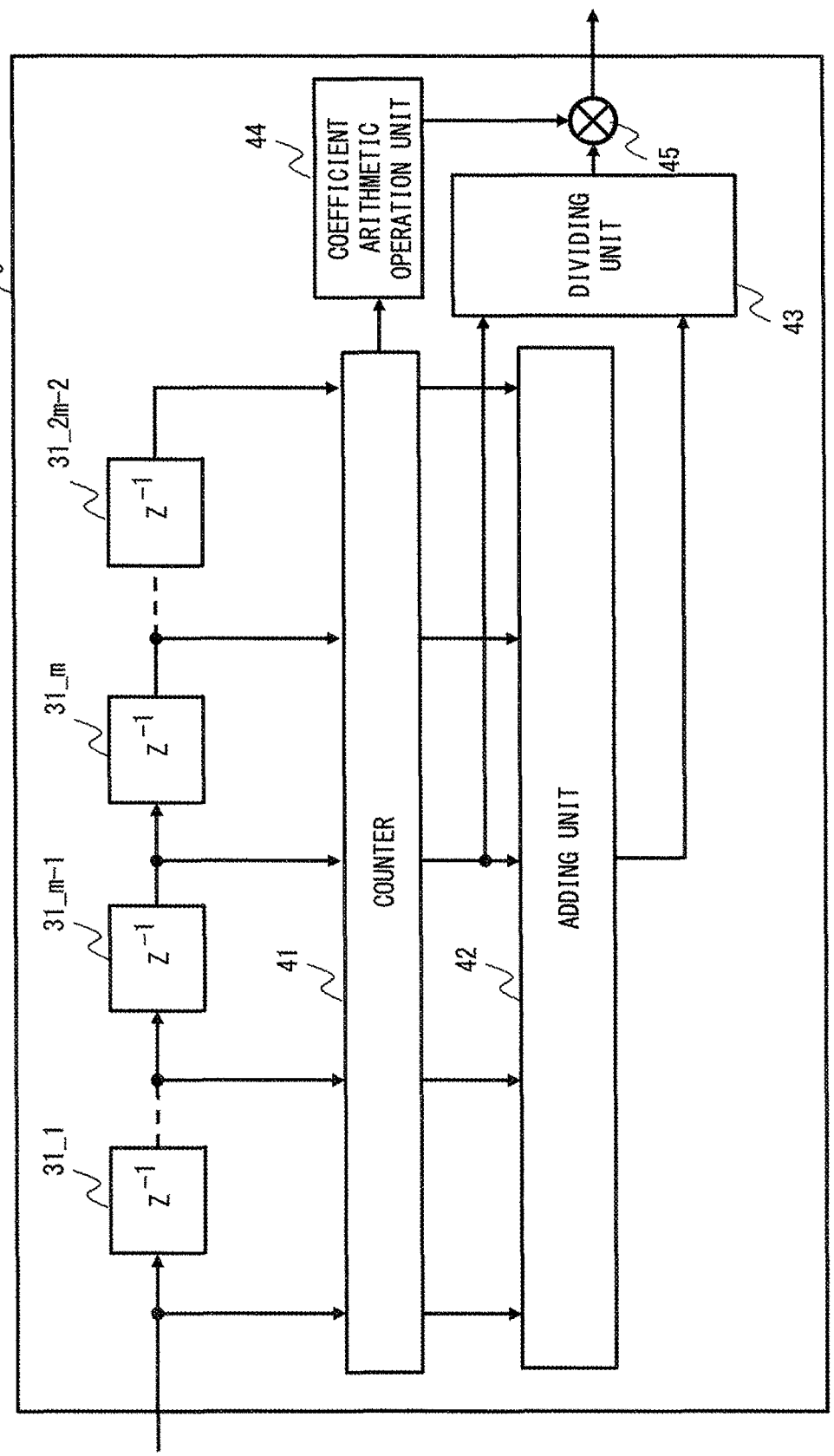
FIG. 6 is a configuration diagram of a weight coefficient generating unit according to a second embodiment.
Figure 7:
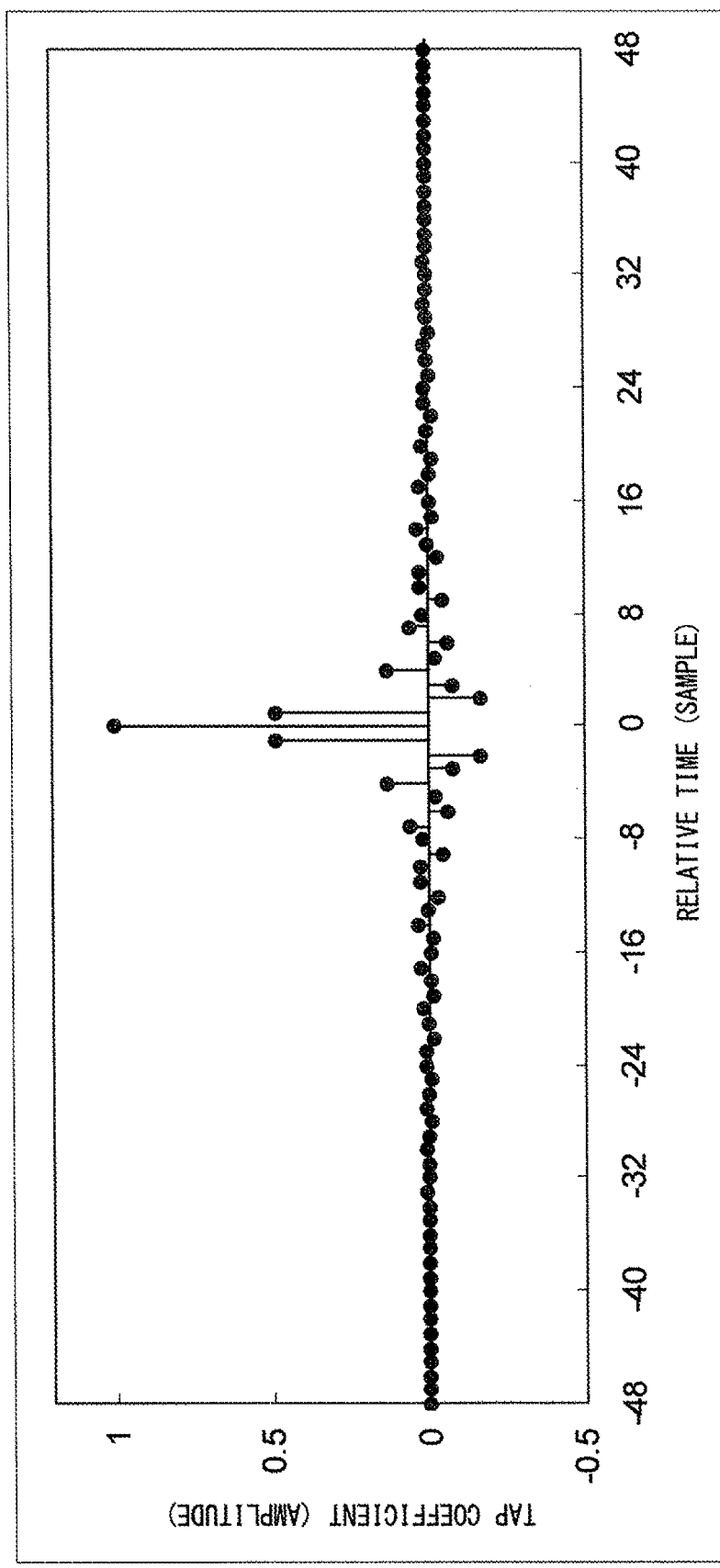
FIG. 7 is a view illustrating tap coefficients of a band limiting filter.

The configuration of the weight coefficient generating unit 40 illustrated in FIG. 6 is effective when several taps before and after a center tap of the tap coefficients of the band limiting filter 13 take values close to substantially one multiple similar to, for example, tap coefficients illustrated in FIG. 8. The number of taps which is 2m−1 only needs to be configured to be selected from several taps before and after a center tap at which an overlap influence is dominant among the taps of the band limiting filter 13 to reduce a circuit scale.

In this regard, in the configuration example of the weight coefficient generating unit 40 illustrated in FIG. 6, a tap coefficient multiplier is removed for a purpose of simplification, and the FIR filter whose tap coefficients are all one multiple is used. Hence, it is necessary to approximate tap influences in the band limiting filter 13 and obtain the same characteristics as those of the configuration example of the weight coefficient generating unit 15 illustrated in FIG. 3. A method of calculating a weight coefficient in the weight coefficient generating unit 40 will be described below.

Upon calculation of a weight coefficient, when an output of the threshold subtracting unit 22 at a k (=1 to 2m−1)th tap is (Rk−Th), the division result C/D in the dividing unit 43 is expressed as in following equation 2.

[Mathematical 2]

$$\frac{(Rm - Th)}{\sum_{k=1}^{2m-1} (Rk - Th)} \quad (2)$$

Figure 3:
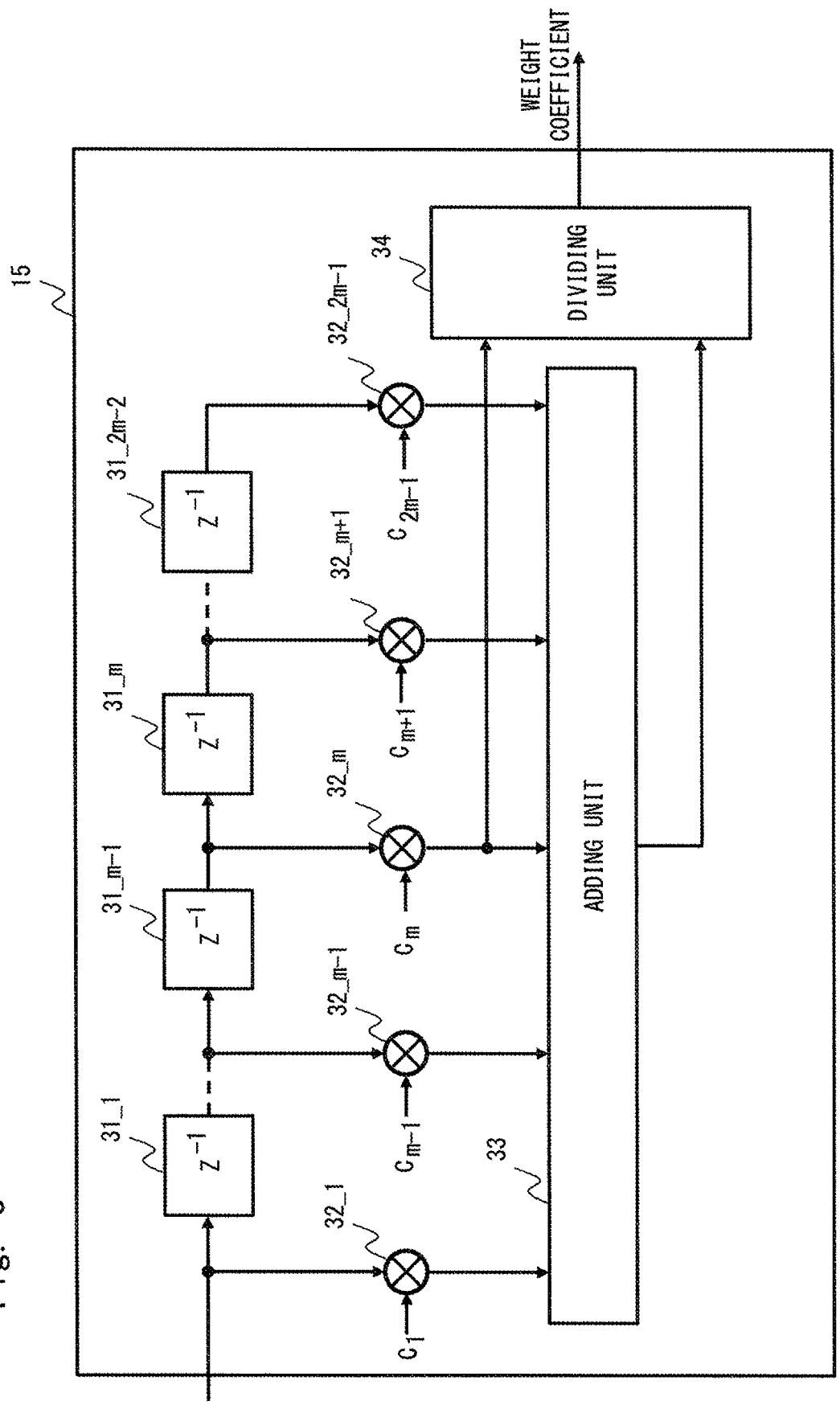
FIG. 3 is a configuration diagram of a weight coefficient generating unit according to the first embodiment.

The weight coefficient generating unit 40 needs to correct a difference between equation 2 and equation 1 which is a division result A/B in the weight coefficient generating unit 15 illustrated in FIG. 3. In this regard, equation 1 is equal to following equation 3 in which all tap coefficients are normalized by Cm.

[Mathematical 3]

$$\frac{(Rm - Th)}{\sum_{k=1}^{2m-1} \left\{ \frac{Ck}{Cm} * (Rk - Th) \right\}} \quad (3)$$

An influence of the tap coefficient Cm of the center tap on a FIR filter output (total sum) of 2m−1 taps in a denominator of equation 3 depends on the number of pulses. That is, when the number of pulses of Rk−Th≥0 is larger, the total sum of the FIR filter output is high, and, when the number of pulses of Rk−Th≥0 is smaller, the total sum of the FIR filter output is low. Hence, to approximately correct the difference between equation 2 and equation 3 by using a correction coefficient, there is a method of using a correction coefficient corresponding to the number of pulses. To realize such correction processing, the weight coefficient generating unit 40 includes the counter 41 which counts the number of inputted Rk−Th which is not 0 (zero), i.e., counts the number of pulses, and the coefficient arithmetic operation unit 44 which calculates a correction coefficient by using the counted number N of the counter 41 and the function g(N) determined based on the arbitrary setting value D set in advance and the counted number N.

As described above, by using the weight coefficient generating unit 40, it is possible to approximate a tap influence of the band limiting filter 13 at the subsequent stage in the embodiment of the weight coefficient generating unit 40 illustrated in FIG. 6, too. Similar to the weight coefficient generating unit 15 in FIG. 3, the weight coefficient generating unit 40 can suppress a convolution influence (an overlap of pulses) caused by an output of the band limiting filter 13 by multiplying a peak suppression pulse signal from the pulse generating unit 23, by a weight coefficient calculated in the above-described processing.

In addition, the present invention is not limited to the above embodiments, and can be optionally changed without departing from the spirit of the invention.

The present invention has been described above with reference to the embodiments. However, the present invention is not limited to the above. The configurations and the details of the present invention can be variously changed within the scope of the invention as long as one of ordinary skill in the art can understand the changes.

This application claims priority to Japanese Patent Application No. 2013-008592 filed on Jan. 21, 2013, the entire contents of which are incorporated by reference herein.

REFERENCE SIGNS LIST

10 PEAK SUPPRESSING DEVICE
11 SUBTRACTING UNIT
12 MULTIPLYING UNIT
13 BAND LIMITING FILTER
14 SUBTRACTING UNIT
15 WEIGHT COEFFICIENT GENERATING UNIT
21 AMPLITUDE ARITHMETIC OPERATION UNIT
22 THRESHOLD SUBTRACTING UNIT
23 PULSE GENERATING UNIT
24 DELAY ADJUSTING UNIT
25 TAP COEFFICIENT ARITHMETIC OPERATION UNIT
26 DELAY ADJUSTING UNIT
27 DELAY ADJUSTING UNIT
31_1~31_2m−2 1 SAMPLE DELAY UNIT
32_1~32_2m−1 TAP COEFFICIENT MULTIPLYING UNIT
33 ADDING UNIT
35 DIVIDING UNIT
40 WEIGHT COEFFICIENT GENERATING UNIT
41 COUNTER
42 ADDING UNIT
43 DIVIDING UNIT
44 COEFFICIENT ARITHMETIC OPERATION UNIT
45 MULTIPLYING UNIT

The invention claimed is:

1. A peak suppressing device comprising:
   a first subtracting unit that subtracts a predetermined threshold from an amplitude value of an input signal and generates a first peak signal;
   a multiplying unit that multiplies the first peak signal by a weight coefficient and generates a second peak signal;
   a band limiting filter that limits a band of the second peak signal by including a plurality of tap coefficients, and generates a third peak signal;
   a second subtracting unit that subtracts the third peak signal from the input signal; and
   a weight coefficient generating unit that receives the first peak signal as a weight input signal and outputs the weight coefficient as a weight output signal, wherein the weight coefficient generating unit generates the weight coefficient based on an amplitude value of the weight input signal divided by an amplitude value of a fourth peak signal generated when a convolution arithmetic operation is performed on the weight input signal by using at least a tap coefficient used in a center tap of the band limiting filter and tap coefficients used as taps before and after the center tap.

2. The peak suppressing device according to claim 1, wherein the weight coefficient generating unit comprises:
   a shift processing unit that performs shift processing on the weight input signal to generate a plurality of shifted signals, the shift processing unit including a plurality of tap coefficient multiplying units that multiply the plurality of shifted signals by the plurality of tap coefficients,
   an adding unit that adds the plurality of shifted signals multiplied by the tap coefficients, and
   a dividing unit that outputs the weight coefficient as the weight output signal, the weight coefficient being obtained by dividing a dividend by a divisor, wherein the dividend is an amplitude value of a corresponding shifted signal multiplied by a corresponding tap coefficient at a center tap of a tap coefficient multiplying unit among the plurality of tap coefficient multiplying units and wherein the divisor is the amplitude value of the fourth peak signal outputted from the adding unit.

3. The peak suppressing device according to claim 2, wherein the shift processing unit includes the same number of tap coefficient multiplying units as the number of tap coefficient multiplying units included in the band limiting filter.

4. The peak suppressing device according to claim 1, further comprising:
a pulse generating unit that multiplies phase information of the input signal and the first peak signal outputted from the first subtracting unit, and generates a peak suppression pulse,
wherein the multiplying unit multiplies the peak suppression pulse signal by the weight coefficient.

5. The peak suppressing device according to claim 4, further comprising:
a first delay adjusting unit that allocates to the input signal a delay time as a processing time required until the input signal is outputted to the pulse generating unit,
wherein the pulse generating unit multiplies the phase information of the input signal to which the delay time has been allocated and the first peak signal outputted from the first subtracting unit, and generates the peak suppression pulse signal.

6. The peak suppressing device according to claim 1, further comprising:
a second delay adjusting unit that allocates a delay time to the input signal such that a timing of the center tap of the band limiting filter matches with a timing of a peak detection point of a suppression target in the input signal,
wherein the second subtracting unit subtracts the third peak signal from the input signal outputted from the second delay adjusting unit.

7. A peak suppressing method comprising:
subtracting a predetermined threshold from an amplitude value of an input signal;
generating a first peak signal;
generating a weight coefficient based on a value, the value being an amplitude value of the first peak signal divided by an amplitude value of a tap coefficient multiplied peak signal generated when a convolution arithmetic operation is performed on by using at least a tap coefficient used in a center tap of a band limiting filter and tap coefficients used as taps before and after the center tap;
multiplying the first peak signal by the weight coefficient, and generating a second peak signal; and
limiting a band of the second peak signal by using the band limiting filter including the tap coefficients, generating a third peak signal and
subtracting the third peak signal from the input signal.

8. A peak suppressing device comprising:
a first subtracting unit that receives an input signal, subtracts a predetermined threshold from an amplitude value of the input signal, and generates a first peak signal;
a multiplying unit that receives the first peak signal, multiplies the first peak signal by a weight coefficient, and generates a second peak signal;
a band limiting filter comprising a filter including a plurality of tap coefficients, wherein the band limiting filter receives the second peak signal and filters the second peak signal using the filter to generate a third peak signal;
a second subtracting unit that subtracts the third peak signal from the input signal to generate a peak-suppressed signal; and
a weight coefficient generating unit comprising:
a shift processing unit that comprises:
a plurality of shift units that shift the first peak signal by a plurality of different shift amounts to generate a plurality of shifted signals, and
a plurality of tap coefficient multiplying units that multiply the plurality of shifted signals by the plurality of tap coefficients;
a summing unit that sums the plurality of shifted signals multiplied by the tap coefficients to generate a summed signal; and
a dividing unit that divides an amplitude value of a signal output from a center tap coefficient multiplying unit among the plurality of tap coefficient multiplying units by the summed signal and outputs the weight coefficient.

* * * * *